US010586711B2

(12) United States Patent
Muramatsu et al.

(10) Patent No.: US 10,586,711 B2
(45) Date of Patent: Mar. 10, 2020

(54) SUBSTRATE PROCESSING METHOD AND COMPUTER STORAGE MEDIUM

(71) Applicant: Tokyo Electron Limited, Tokyo (JP)

(72) Inventors: Makoto Muramatsu, Koshi (JP); Tadatoshi Tomita, Koshi (JP); Hisashi Genjima, Koshi (JP); Takahiro Kitano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 15/763,529

(22) PCT Filed: Oct. 20, 2016

(86) PCT No.: PCT/JP2016/081118
§ 371 (c)(1),
(2) Date: Mar. 27, 2018

(87) PCT Pub. No.: WO2017/069203
PCT Pub. Date: Apr. 27, 2017

(65) Prior Publication Data
US 2018/0269072 A1 Sep. 20, 2018

(30) Foreign Application Priority Data
Oct. 23, 2015 (JP) ................................. 2015-208718

(51) Int. Cl.
*H01L 21/311* (2006.01)
*G03F 7/16* (2006.01)
(Continued)

(52) U.S. Cl.
CPC .......... *H01L 21/31138* (2013.01); *G03F 7/16* (2013.01); *G03F 7/168* (2013.01);
(Continued)

(58) Field of Classification Search
None
See application file for complete search history.

(56) References Cited

U.S. PATENT DOCUMENTS

2014/0245948 A1* 9/2014 Nguyen .............. B81C 1/00031 117/200
2016/0077439 A1* 3/2016 Pimenta Barros ...... G03F 7/162 216/38

FOREIGN PATENT DOCUMENTS

JP 2013-232621 A 11/2013
JP 2013-247159 A 12/2013
JP 2016-105455 A 6/2016

OTHER PUBLICATIONS

International Search Report of the International Searching Authority dated Jan. 17, 2017 issued in corresponding international application No. PCT/JP2016/081118 (and English translation).

* cited by examiner

*Primary Examiner* — Roberts P Culbert
(74) *Attorney, Agent, or Firm* — Posz Law Group, PLC

(57) ABSTRACT

A substrate processing method of processing a substrate using a block copolymer containing a hydrophilic polymer and a hydrophobic polymer, the substrate processing method includes: a block copolymer coating step of applying the block copolymer onto the substrate on which a predetermined projecting and recessed pattern is formed, to form a coating film of the block copolymer; a polymer separation step of phase-separating the block copolymer into the hydrophilic polymer and the hydrophobic polymer; a polymer removal step of selectively removing the hydrophilic polymer from the phase-separated block copolymer; and after the block copolymer coating step and before the polymer removal step, a film thickness reduction step of reducing a film thickness of the coating film of the block copolymer.

12 Claims, 11 Drawing Sheets

(51) Int. Cl.

| | |
|---|---|
| ***G03F 7/20*** | (2006.01) |
| ***G03F 7/30*** | (2006.01) |
| ***G03F 7/38*** | (2006.01) |
| ***G03F 7/42*** | (2006.01) |
| ***H01L 21/027*** | (2006.01) |
| ***H01L 21/67*** | (2006.01) |

(52) U.S. Cl.

CPC .............. *G03F 7/2002* (2013.01); *G03F 7/30* (2013.01); *G03F 7/38* (2013.01); *G03F 7/422* (2013.01); *H01L 21/0276* (2013.01); *H01L 21/67069* (2013.01); *H01L 21/67225* (2013.01)

2
G2
G3
G4
44
43
42
41
40
70
80
D
50
51
52
53
54
55
56
60
61
62
92
23
C
21
20
10
11
12
13
Y

SUBSTRATE PROCESSING METHOD AND COMPUTER STORAGE MEDIUM

CROSS REFERENCE TO RELATED APPLICATIONS

This application is based upon and claims the benefit of priority of the prior Japanese Patent Application No. 2015-208718, filed in Japan on Oct. 23, 2015, the entire contents of which are incorporated herein by reference.

Technical Field

The present invention relates to a substrate processing method and a computer storage medium, using a block copolymer containing a hydrophilic (polar) polymer having a hydrophilic property (polarity) and a hydrophobic (non-polar) polymer having a hydrophobic property (no polarity).

Background Art

For example, in a manufacturing process of a semiconductor device, photolithography processing is performed in which, for example, a resist coating treatment of applying a resist solution onto a semiconductor wafer (hereinafter, referred to as a "wafer") to form a resist film, exposure processing of exposing a predetermined pattern on the resist film, a developing treatment of developing the exposed resist film and so on are performed in sequence to form a predetermined resist pattern on the wafer. Then, using the resist pattern as a mask, etching processing is performed on a film to be processed on the wafer and a removal treatment of the resist film is thereafter performed, to form a predetermined pattern in the film to be processed.

Incidentally, for higher integration of semiconductor devices, miniaturization of the above-described pattern of the film to be processed is required in recent years. Therefore, the resist pattern is increasingly miniaturized and, for example, the wavelength of light for the exposure processing in the photolithography processing is increasingly shortened. However, there are technical and cost limits in shortening the wavelength of an exposure light source, and it is now difficult to form a fine resist pattern on the order of, for example, several nanometers only by the method of increasingly shortening the wavelength of light.

Hence, there is a proposed wafer processing method using a block copolymer composed of two kinds of hydrophilic and hydrophobic block chains (polymers) (Patent Document 1). In this method, first, a guide is formed on the wafer, for example, by a resist pattern. Then, a block copolymer is applied onto the wafer, and a heat treatment is performed on the block copolymer to phase-separate the block copolymer into a hydrophilic polymer and a hydrophobic polymer. Thereafter, irradiating the wafer with an ultraviolet ray to modify the polymer. By supplying an organic solvent onto the wafer, the hydrophilic polymer is selectively removed. Thus, a fine pattern of the hydrophobic polymer is formed on the wafer. Then, using the pattern of the hydrophobic polymer as a mask, a predetermined pattern is transferred to the film to be processed.

PRIOR ART DOCUMENT

Patent Document

[Patent Document 1] Japanese Laid-open Patent Publication No. 2013-232621

DISCLOSURE OF THE INVENTION

Problems to Be Solved by the Invention

Incidentally, the guide formed by the resist pattern has a projecting and recessed shape. The projecting and recessed pattern generally has a sparse portion and a dense portion, and the film thickness of the coating film of the block copolymer differs between the sparse portion and dense portion. Specifically, the film thickness is small at the dense portion, and the film thickness is large at sparse portion. Therefore, the supply amount of the coating solution when forming the coating film is set such that the film thickness at the sparse portion becomes about 20 nm to 30 nm.

However, it has been confirmed by the present inventors that the hydrophilic polymer and the hydrophobic polymer are arrayed in an unintended shape at the sparse portion after the phase separation of the block copolymer in some cases depending on the setting of the film thickness at the sparse portion. This causes a problem of a pattern in the unintended shape being transferred to the film to be processed, failing to make the film to be processed into a desired shape.

The present invention has been made in consideration of the points, and its object is to appropriately form a predetermined pattern on a substrate in substrate processing using a block copolymer containing a hydrophilic polymer and a hydrophobic polymer.

Means for Solving the Problems

To achieve the above object, one aspect of the present invention is a substrate processing method of processing a substrate using a block copolymer containing a hydrophilic polymer and a hydrophobic polymer, the substrate processing method includes: a block copolymer coating step of applying the block copolymer onto the substrate on which a predetermined projecting and recessed pattern is formed, to form a coating film of the block copolymer; a polymer separation step of phase-separating the block copolymer into the hydrophilic polymer and the hydrophobic polymer; a polymer removal step of selectively removing the hydrophilic polymer from the phase-separated block copolymer; and after the block copolymer coating step and before the polymer removal step, a film thickness reduction step of reducing a film thickness of the coating film of the block copolymer.

The present invention includes the film thickness reduction step of reducing the film thickness of the coating film of the block copolymer, so that the film thickness reduction step is executed before the polymer separation step to reduce, for example, the film thickness at the portion where the projecting and recessed pattern is sparse to a predetermined film thickness or less, thereby making it possible to prevent the hydrophilic polymer and the hydrophobic polymer from being arrayed in an unintended shape at the sparse portion after the polymer separation step. Further, the film thickness reduction step is performed after the polymer separation step to reduce the film thickness of the coating film composed of the hydrophilic polymer and the hydrophobic polymer arrayed in the unintended shape, thereby making it possible to prevent the unintended shape from being transferred to a base, for example, in the case of using the pattern of the hydrophobic polymer as a mask for etching. Therefore, according to one aspect of the present invention, a predetermined pattern can be appropriately formed on a substrate in substrate processing using a block copolymer containing a hydrophilic polymer and a hydrophobic polymer.

An aspect of the present invention according to another viewpoint is a computer readable storage medium storing a program running on a computer of a control unit which controls a substrate processing system to cause the substrate processing system to execute the substrate processing method.

Effect of the Invention

According to the present invention, it is possible to appropriately form a predetermined pattern on a substrate in substrate processing using a block copolymer containing a hydrophilic polymer and a hydrophobic polymer.

BEST MODE FOR CARRYING OUT THE INVENTION

Figure 1:
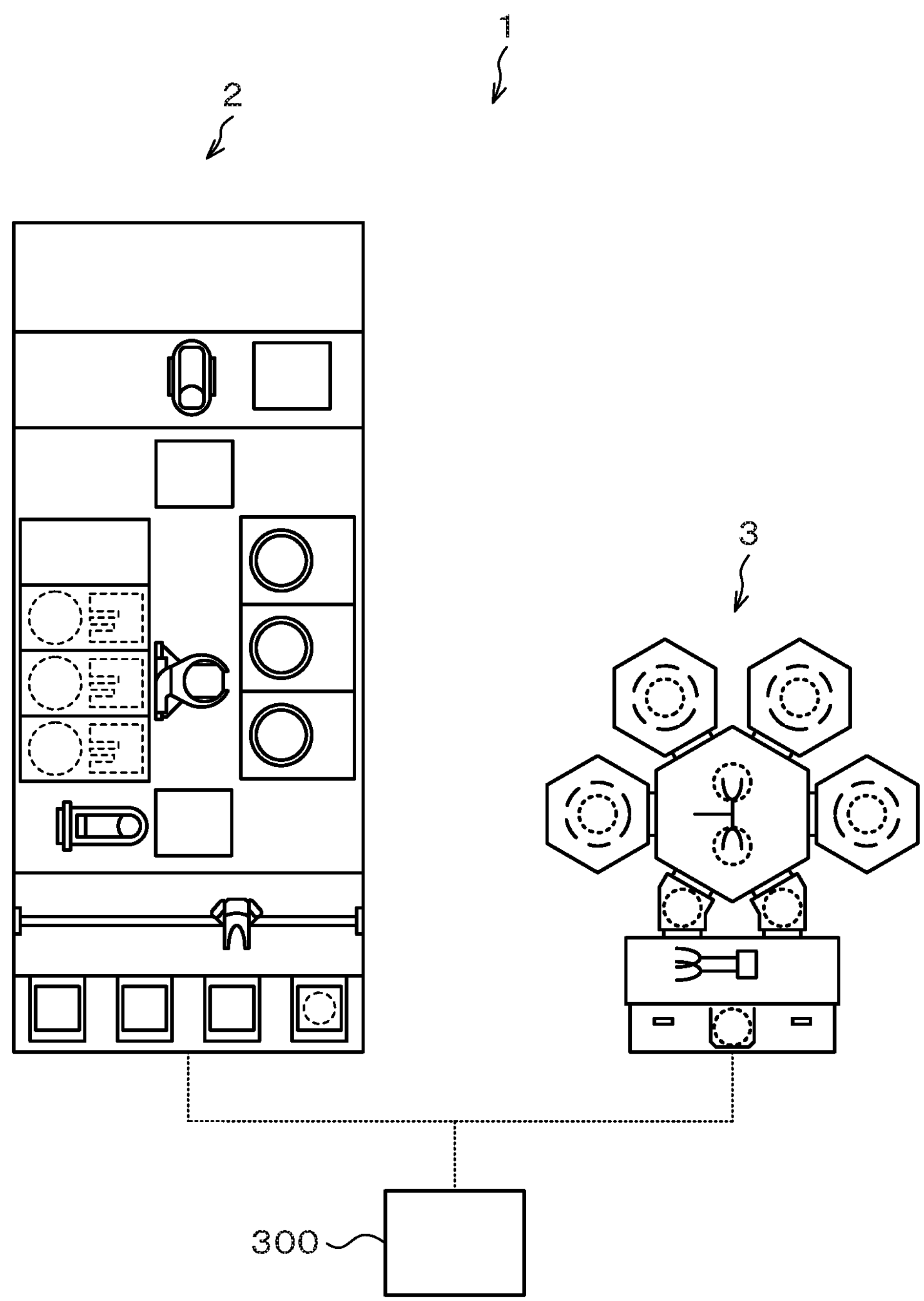
FIG. 1 A plane explanatory view illustrating the outline of a configuration of a substrate processing system according to this embodiment.

Hereinafter, an embodiment of the present invention will be described. FIG. 1 is a plane explanatory view illustrating the outline of a configuration of a substrate processing system 1 executing a substrate processing method according to this embodiment. Note that in this description and the drawings, components having substantially the same functional configurations are denoted by the same numerals to omit duplicated description.

The substrate processing system 1 has a coating treatment apparatus 2 which performs a solution treatment such as a photolithography treatment on a wafer as a substrate, and a plasma processing apparatus 3 which performs plasma processing on the wafer.

Figure 2:
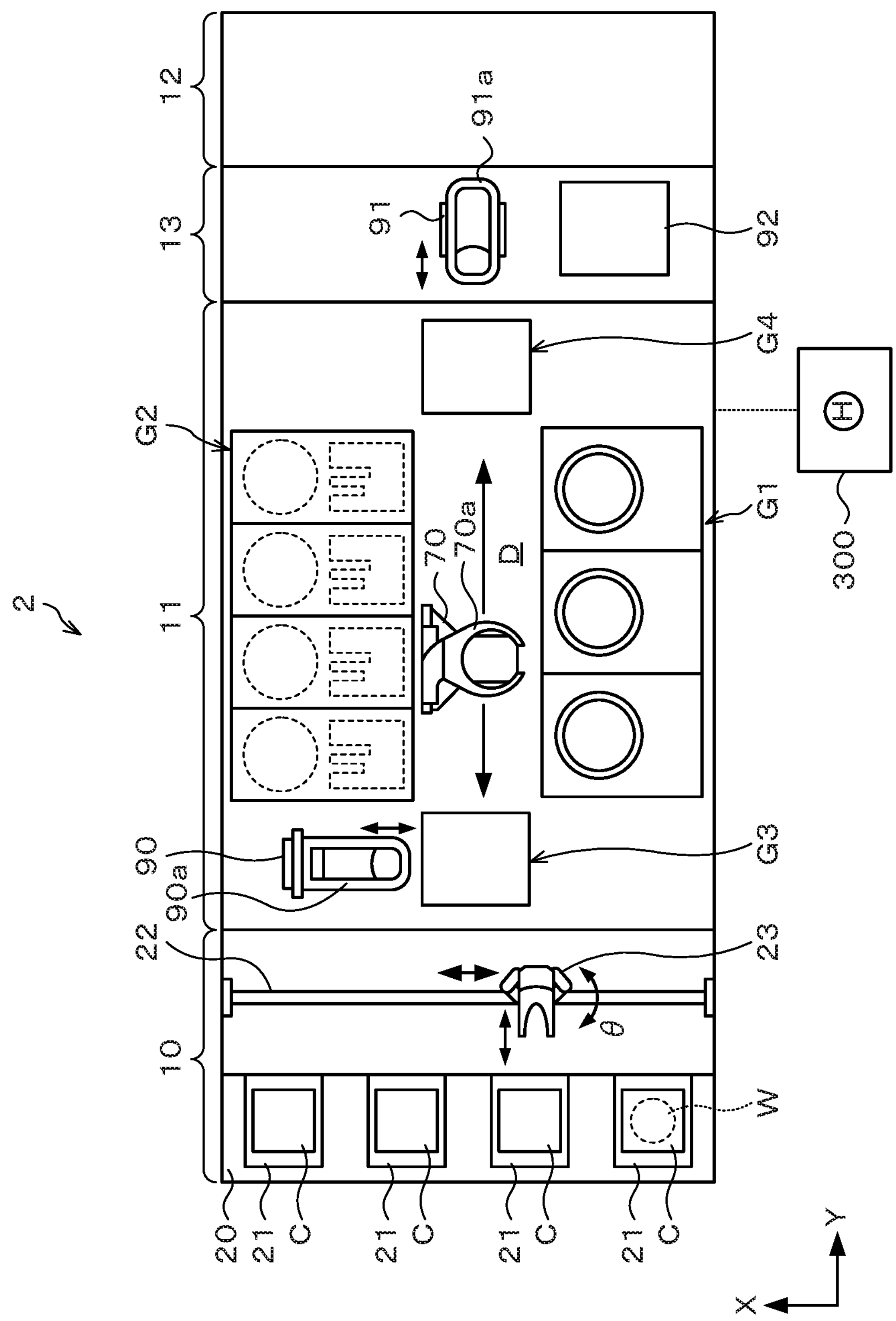
FIG. 2 A plane explanatory view illustrating the outline of a configuration of a coating treatment apparatus.
Figure 3:
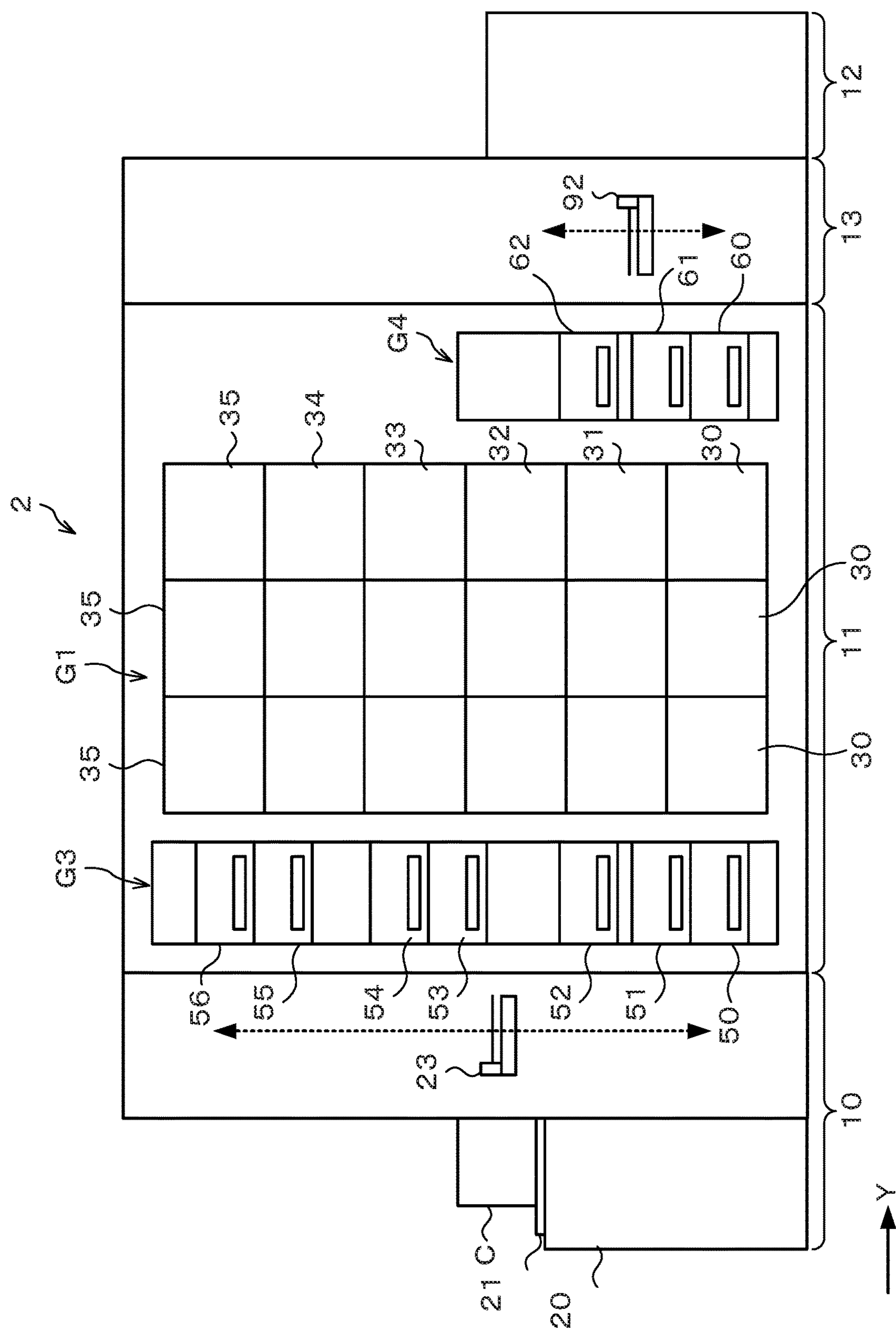
FIG. 3 A front explanatory view illustrating the outline of the configuration of the coating treatment apparatus.
Figure 4:
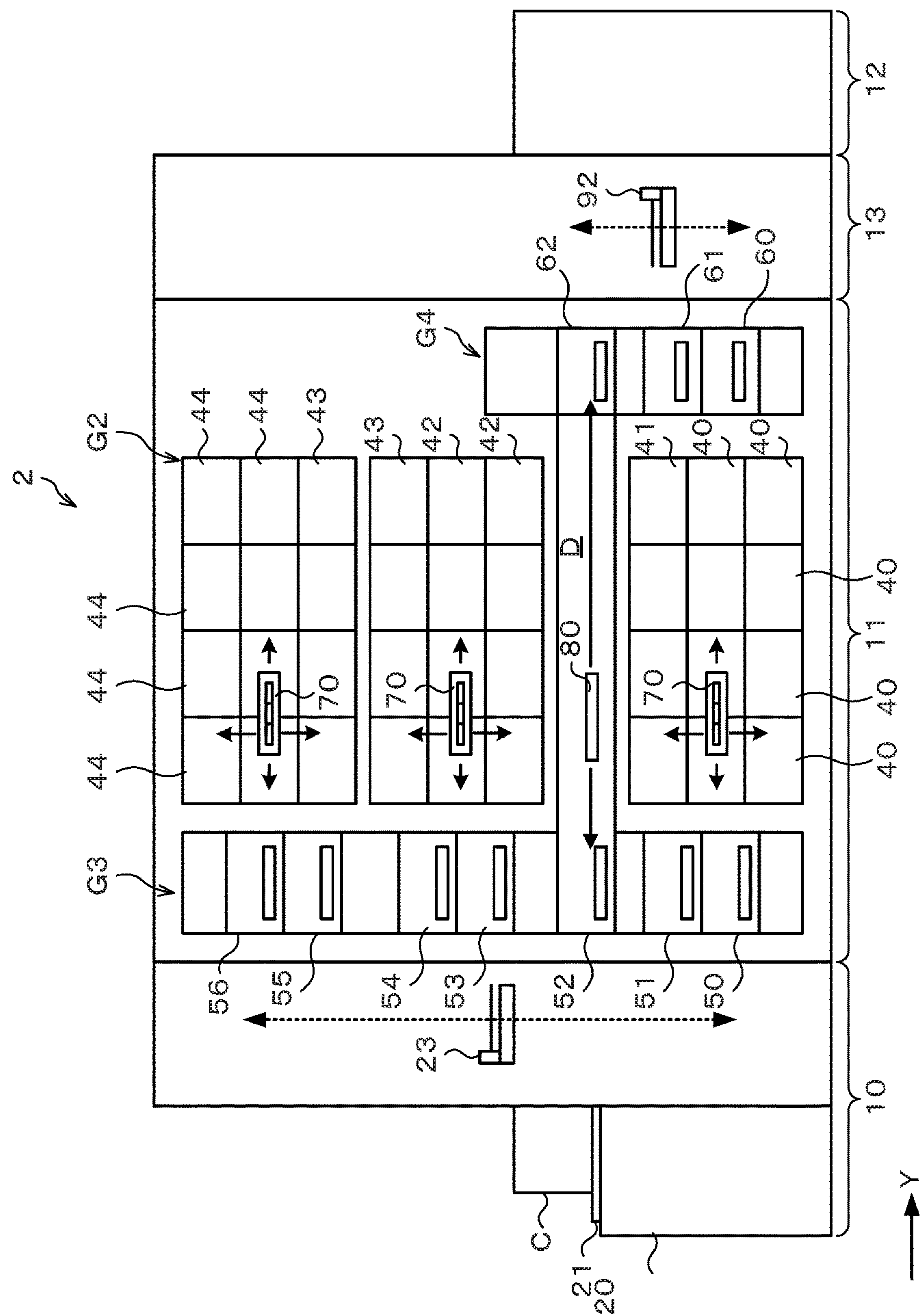
FIG. 4 A rear explanatory view illustrating the outline of the configuration of the coating treatment apparatus.

FIG. 2 is a plane explanatory view of the coating treatment apparatus 2, and FIG. 3 and FIG. 4 are a front view and a rear view schematically illustrating the outline of an internal configuration of the substrate processing system 1, respectively. The coating treatment apparatus 2 in this embodiment is to perform solution treatments such as a coating treatment and a developing treatment.

The coating treatment apparatus 2 has, as illustrated in FIG. 2, a configuration in which a cassette station 10 into/out of which a cassette C housing a plurality of wafers W is carried, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are carried in/out from/to the outside of the substrate processing system 1.

In the cassette station 10, a wafer carrier apparatus 23 is provided which is movable on a carrier path 22 extending in an X-direction as illustrated in FIG. 2. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 2) in the treatment station 11, and the second block G2 is provided on the rear side (X-direction positive direction side in FIG. 2) in the treatment station 11. Further, the third block G3 is provided on the cassette station 10 side (Y-direction negative direction side in FIG. 2) in the treatment station 11, and the fourth block G4 is provided on the interface station 13 side (Y-direction positive direction side in FIG. 2) in the treatment station 11.

For example, in the first block G1, as illustrated in FIG. 3, a plurality of solution treatment apparatuses, for example, developing apparatuses 30 each of which performs a developing treatment on the wafer W, organic solvent supply apparatuses 31 as polymer removal apparatuses each of which supplies an organic solvent onto the wafer W, anti-reflection film forming apparatuses 32 each of which forms an anti-reflection film on the wafer W, neutral layer forming apparatuses 33 each of which applies a neutralizing agent onto the wafer W to form a neutral layer, resist coating apparatuses 34 each of which applies a resist solution onto the wafer W to form a resist film, and block copolymer coating apparatuses 35 each of which applies a block copolymer onto the wafer W, are stacked in order from the bottom.

For example, the developing apparatuses 30, the organic solvent supply apparatuses 31, the anti-reflection film forming apparatuses 32, the neutral layer forming apparatuses 33, the resist coating apparatuses 34, and the block copolymer coating apparatuses 35 are arranged three each side by side in the horizontal direction. Note that the numbers and the arrangement of the solution treatment apparatuses can be arbitrarily selected.

In these solution apparatuses, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W.

Note that the block copolymer to be applied onto the wafer W in the block copolymer coating apparatus 35 is a macromolecule (copolymer) having a first polymer (a polymer of first monomers) and a second polymer (a polymer of second monomers) in which the first monomers and the second monomers are polymerized into a linear chain. As the first polymer, a hydrophilic polymer having a hydrophilic property (polarity) is used, and as the second polymer, a hydrophobic polymer having a hydrophobic property (no polarity) is used. In this embodiment, for example, polymethyl methacrylate (PMMA) is used as the hydrophilic polymer, and, for example, polystyrene (PS) is used as the hydrophobic polymer. Further, the ratio of a molecular weight of the hydrophilic polymer in the block copolymer is about 20% to 40%, and the ratio of a molecular weight of the hydrophobic polymer in the block copolymer is about 80% to 60%. Besides, the block copolymer is obtained by making the copolymer of the hydrophilic polymer and the hydrophobic polymer into a solution by using a solvent.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral layer. Hereinafter, "neutral" means the case having the intermediate affinity to the hydrophilic polymer and the hydrophobic polymer as described above.

For example, in the second block G2, as illustrated in FIG. 4, thermal treatment apparatuses 40 each of which performs a thermal treatment on the wafer W, ultraviolet irradiation apparatus 41 each of which irradiates the wafer W with an ultraviolet ray, adhesion apparatuses 42 each of which performs a hydrophobic treatment on the wafer W, edge exposure apparatuses 43 each of which exposes the outer peripheral portion of the wafer W, and polymer separation apparatuses 44 each of which phase-separates the block copolymer applied on the wafer W in the block copolymer coating apparatus 35 into the hydrophilic polymer and the hydrophobic polymer, are arranged side by side in the vertical direction and in the horizontal direction. Note that the numbers and the arrangement of the thermal treatment apparatuses 40, the ultraviolet irradiation apparatus 41, the adhesion apparatuses 42, and the edge exposure apparatuses 43, and the polymer separation apparatuses 44 can be arbitrarily selected.

The thermal treatment apparatus 40 has a hot plate which mounts and heats the wafer W thereon and a cooling plate which mounts and cools the wafer W thereon, and thereby can perform both of a heat treatment and a cooling treatment. Note that the polymer separation apparatus 44 is also an apparatus that performs a thermal treatment on the wafer W, and its configuration is the same as that of the thermal treatment apparatus 40.

Figure 5:
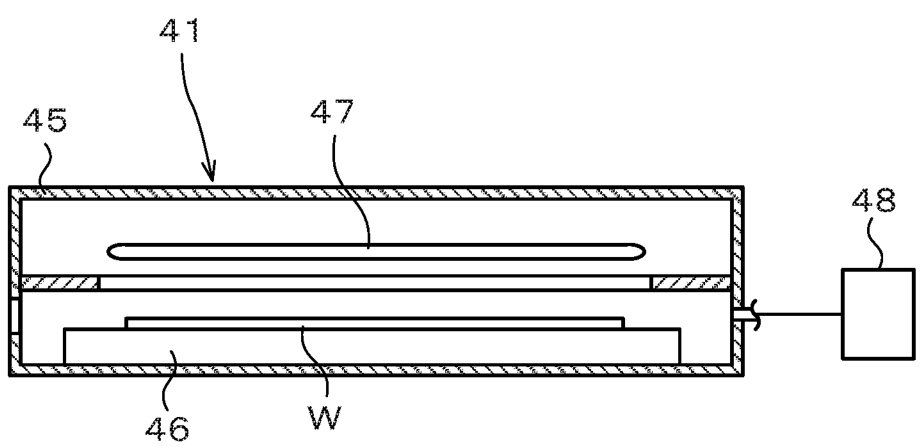
FIG. 5 A cross-sectional explanatory view illustrating the outline of a configuration of an ultraviolet irradiation unit.

The ultraviolet irradiation apparatus 41 has, as illustrated in FIG. 5, a treatment container 45 which hermetically houses the wafer W, a mounting table 46 on which the wafer W is mounted, an ultraviolet irradiation unit 47 which irradiates the wafer W on the mounting table 46 with an ultraviolet ray having a wavelength of, for example, 172 nm, and a gas supply source 48 which supplies a clean oxygen-containing gas into the treatment container 45. In the mounting table 46, a not-illustrated heater is embedded and can heat the wafer W mounted on the mounting table 46 to a predetermined temperature.

For example, in the third block G3, a plurality of delivery apparatuses 50, 51, 52, 53, 54, 55, 56 are provided in order from the bottom as illustrated in FIG. 4. Further, in the fourth block G4, a plurality of delivery apparatuses 60, 61, 62 are provided in order from the bottom.

A wafer carry region D is formed in a region surrounded by the first block G1 to the fourth block G4 as illustrated in FIG. 2. In the wafer carry region D, for example, a plurality of wafer carrier apparatuses 70 are arranged each of which has a carrier arm 70*a* that is movable, for example, in the Y-direction, the X-direction, the θ-direction, and the vertical direction. The wafer carrier apparatus 70 can move in the wafer carry region D to carry the wafer W to a predetermined apparatus in the first block G1, the second block G2, the third block G3 and the fourth block G4 therearound.

Further, in the wafer carrier region D, as illustrated in FIG. 4, a shuttle carrier apparatus 80 is provided which linearly carries the wafer W between the third block G3 and the fourth block G4.

The shuttle carrier apparatus 80 is configured to be linearly movable, for example, in the Y-direction. The shuttle carrier apparatus 80 can move in the Y-direction while supporting the wafer W, and carry the wafer W between the delivery apparatus 52 in the third block G3 and the delivery apparatus 62 in the fourth block G4.

As illustrated in FIG. 2, a wafer carrier apparatus 90 is provided adjacent on the X-direction positive direction side of the third block G3. The wafer carrier apparatus 90 has a carrier arm 90*a* that is movable, for example, in the X-direction, the θ-direction, and the vertical direction. The wafer carrier apparatus 90 can move up and down while supporting the wafer W to carry the wafer W to each of the delivery apparatuses in the third block G3.

In the interface station 13, a wafer carrier apparatus 91 and a delivery apparatus 92 are provided. The wafer carrier apparatus 91 has a carrier arm 91*a* that is movable, for example, in the Y-direction, the θ-direction, and the vertical direction. The wafer carrier apparatus 91 can carry the wafer W to/from each of the delivery apparatuses in the fourth block G4, the delivery apparatus 92 and the exposure apparatus 12, for example, while supporting the wafer W by the carrier aim.

Figure 6:
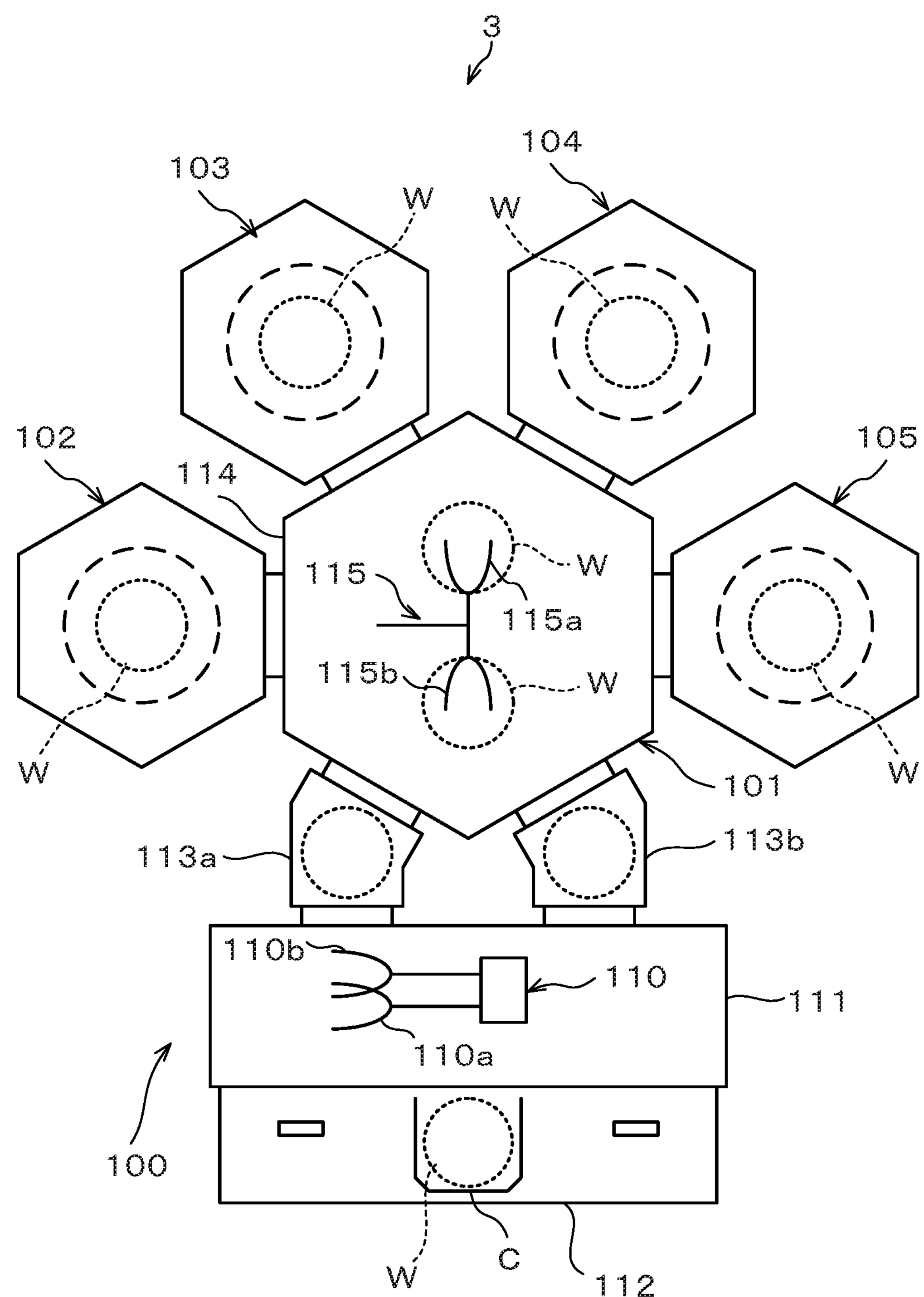
FIG. 6 A plane explanatory view illustrating the outline of a configuration of a plasma processing apparatus.

The plasma processing apparatus 3 has, as illustrated in FIG. 6, a cassette station 100 which carries the wafer W to/from the plasma processing apparatus 3, a common carrier unit 101 which carries the wafer W, etching apparatuses 102, 103 as polymer removal apparatuses each of which performs plasma etching processing on the wafer W to selectively remove either the hydrophilic polymer or the hydrophobic polymer, and etching apparatuses 104, 105 each of which etches the film to be processed on the wafer W into a predetermined pattern.

The cassette station 100 has a carrier room 111 which is provided with a wafer carrier mechanism 110 carrying the wafer W therein. The wafer carrier mechanism 110 has two carrier arms 110*a*, 110*b* each of which substantially horizontally holds the wafer W and is configured to carry the wafer W while holding the wafer W by one of the carrier arms 110*a*, 110*b*. On the lateral side of the carrier room 111, a cassette mounting table 112 is provided on which a cassette C capable of housing a plurality of wafers W arranged side by side therein is mounted. In the illustrated example, a plurality of, for example, three cassettes C can be mounted on the cassette mounting table 112.

The carrier room 111 and the common carrier unit 101 are coupled to each other via two load-lock apparatuses 113*a*, 113*b* which can be evacuated.

The common carrier unit 101 has a carrier room chamber 114 having a hermetically closable structure formed in a substantially polygonal shape (a hexagonal shape in the illustrated example) as seen from above. In the carrier room chamber 114, a wafer carrier mechanism 115 which carries the wafer W is provided. The wafer carrier mechanism 115 has two carrier arms 115*a*, 115*b* each of which substantially horizontally holds the wafer W and is configured to carry the wafer W while holding the wafer W by one of the carrier arms 115*a*, 115*b*.

Outside the carrier room chamber 114, the etching apparatuses 102 to 105 and the load-lock apparatuses 113*a*, 113*b* are arranged to surround the periphery of the carrier room chamber 114. The etching apparatuses 102 to 105 and the load-lock apparatuses 113*a*, 113*b* are arranged to be placed side by side in this order in the clockwise direction, for example, as seen from above, and to face to six side surface portions of the carrier room chamber 114 respectively.

As the etching apparatuses 202 to 205, for example, an RIE (Reactive Ion Etching) apparatus is used. More specifically, in the etching apparatuses 202 to 205, dry etching is performed which etches the hydrophilic polymer and the film to be processed using reactive gas (etching gas), ions, or radicals.

In the above substrate processing system 1, a control unit 300 is provided as illustrated in FIG. 1. The control unit 300 is, for example, a computer and has a program storage unit (not illustrated). In the program storage unit, a program that controls the treatments and processing on the wafer W in the substrate processing system 1 is stored. Further, the program storage unit also stores a program that controls the operations of the above-described various treatment apparatuses and a driving system such as the carrier apparatuses to realize wafer processing in the substrate processing system 1. Note that the programs may be the ones which are recorded, for example, in a computer-readable storage medium such as a computer-readable hard disk (HD), flexible disk (FD), compact disk (CD), magneto-optical disk (MO), or memory card and installed from the storage medium into the control unit 300.

Figure 7:
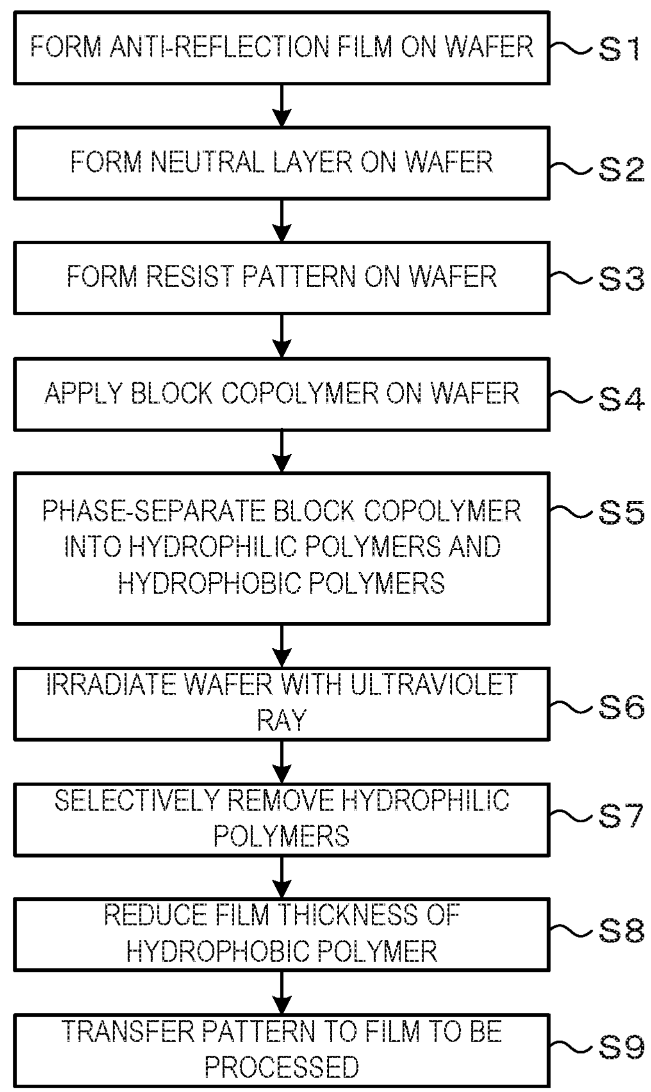
FIG. 7 A flowchart explaining main steps of wafer processing.

The substrate processing system 1 according to this embodiment is configured as described above. Next, wafer processing performed using the substrate processing system 1 configured as described above will be described first, and then the principle and action of the present invention will be described. FIG. 7 is a flowchart illustrating examples of main steps of the wafer processing.

First, the cassette C housing a plurality of wafers W is carried into the cassette station 10 of the coating treatment apparatus 2. The wafers W in the cassette C are successively carried to the thermal treatment apparatus 40 in the treatment station 11 and temperature-regulated.

Figure 8:
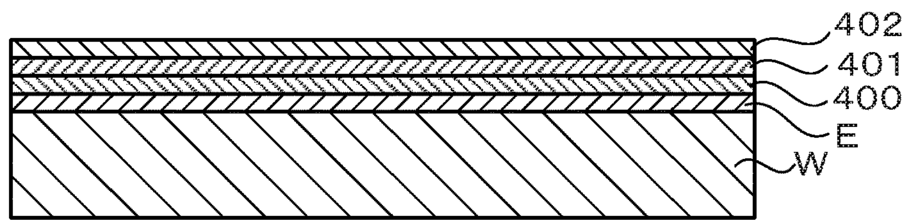
FIG. 8 A longitudinal-sectional explanatory view illustrating an appearance in which an anti-reflection film, a neutral layer, and a resist film are formed on a wafer.

The wafer W is then carried to the anti-reflection film forming apparatus 32, in which an anti-reflection film 400 is formed on the wafer W as illustrated in FIG. 8 (Step S1 in FIG. 7). Note that on the wafer W in this embodiment, a film to be processed E has been formed in advance on the upper surface of the wafer W, and the anti-reflection film 400 is formed on the upper surface of the film to be processed E. The wafer W is then carried to the thermal treatment apparatus 40 and heated and temperature-regulated.

The wafer W is then carried by the wafer carrier apparatus 70 to the neutral layer forming apparatus 33. In the neutral layer forming apparatus 33, a neutralizing agent is applied onto the anti-reflection film 400 on the wafer W as illustrated in FIG. 8 to form a neutral layer 401 (Step S2 in FIG. 7). Thereafter, the wafer W is carried to the thermal treatment apparatus 40 and heated and temperature-regulated, and then returned to the delivery apparatus 53.

The wafer W is then carried to the adhesion apparatus 42 and subjected to an adhesion treatment. The wafer W is then carried to the resist coating apparatus 34, in which a resist solution is applied onto the anti-reflection film 400 of the wafer W to form a resist film 402 as illustrated in FIG. 8. Thereafter, the wafer W is carried to the thermal treatment apparatus 40 and subjected to a pre-baking treatment. The wafer W is then carried to the edge exposure apparatus 43 and subjected to edge exposure processing.

Figure 9:
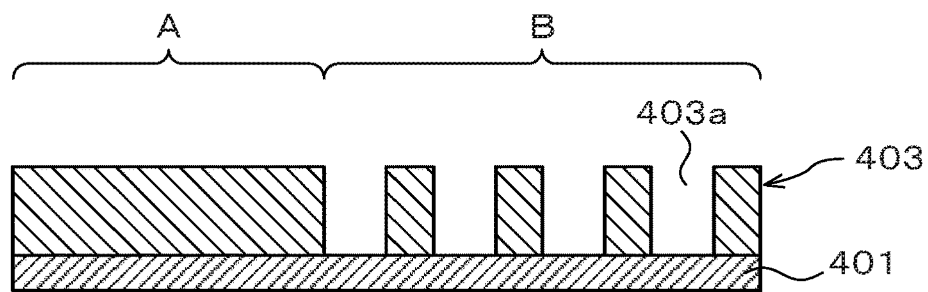
FIG. 9 A longitudinal-sectional explanatory view illustrating an appearance in which a resist pattern is formed on the neutral layer.
Figure 10:
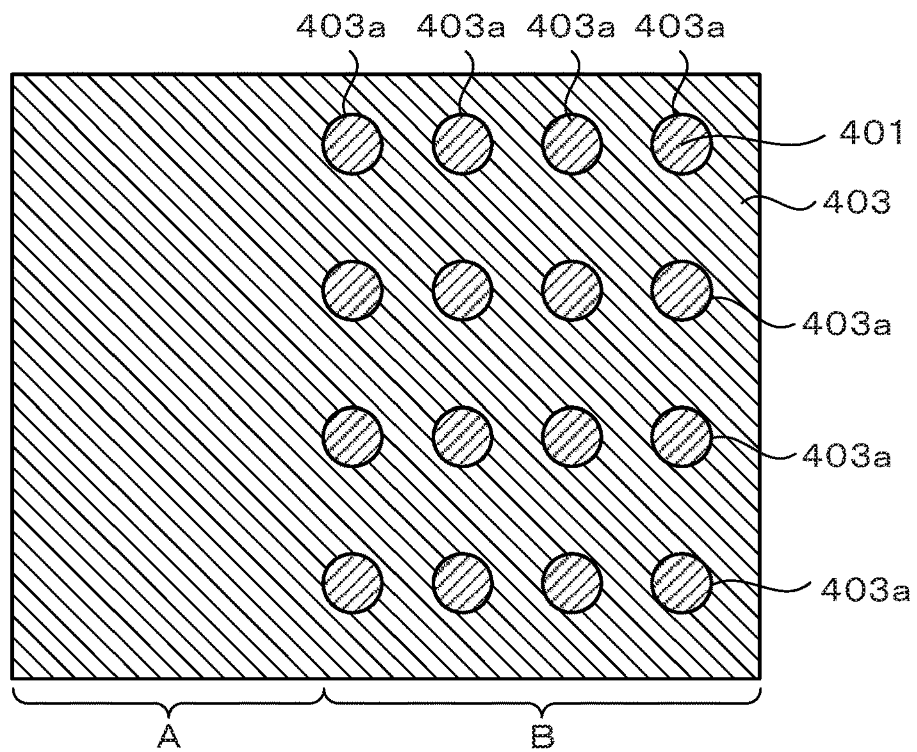
FIG. 10 A plane explanatory view illustrating the appearance in which the resist pattern is formed on the neutral layer.

Thereafter, the wafer W is carried by the wafer carrier apparatus 91 in the interface station 13 to the exposure apparatus 12 and subjected to exposure processing. The wafer W is then carried to the thermal treatment apparatus 40 and subjected to a post-exposure baking treatment. The wafer W is thereafter carried to the developing apparatus 30 and subjected to a developing treatment. After the development ends, the wafer W is carried to the thermal treatment apparatus 40 and subjected to a post-baking treatment. Thus, a projecting and recessed resist pattern 403 by the resist film 402 is formed on the anti-reflection film 400 of the wafer W as illustrated in FIG. 9, FIG. 10 (Step S3 in FIG. 7). Note that the resist pattern 403 formed in this embodiment has a first region A being a sparse portion where no projections and recesses are formed and a second region B being a dense portion where a plurality of circular hole portions 403*a* are formed in a lattice form. FIG. 9 is drawn with the films lower than the neutral layer 401 omitted.

The wafer W is then carried to the block copolymer coating apparatus 35, in which a block copolymer 404 is applied on the resist pattern 403 (block copolymer coating step, Step S4 in FIG. 7).

Figure 11:
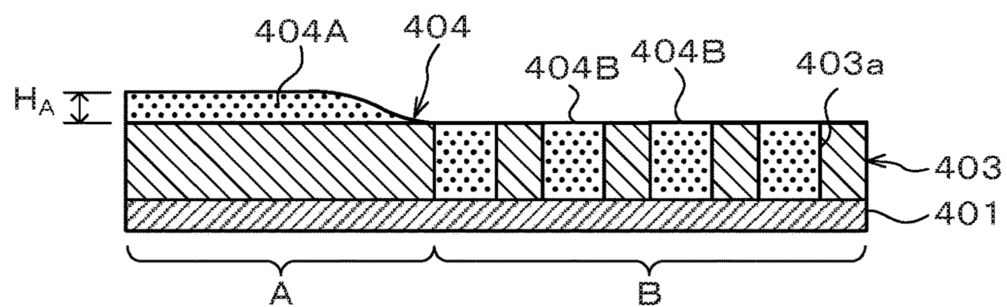
FIG. 11 A longitudinal-sectional explanatory view illustrating an appearance in which a block copolymer is applied on the resist pattern.

In this event, a film thickness $H_A$ of the block copolymer 404 in the first region A (hereinafter, referred to as a "block copolymer 404A") is larger than a film thickness of the block copolymer 404 in the second region B (hereinafter, referred to as a "block copolymer 404B") due to the surface tension and viscosity of the block copolymer 404 applied on the wafer W as illustrated in FIG. 11. Specifically, the block copolymer 404B in the second region B is to have a film thickness at the same level as the height of the hole portions 403*a* of the resist pattern 403, and the block copolymer 404A in the first region A is to exist above the upper surface of the protruding portion in the resist pattern 403 in the projecting and recessed shape. Note that the film thickness $H_A$ of the block copolymer 404A hereinafter means the film thickness of the block copolymer 404 existing above the upper surface of the protruding portion in the resist pattern 403. Besides, in this embodiment, the supply amount of the block copolymer 404 is set so that the film thickness $H_A$ becomes almost 20 nm to 30 nm.

Figure 12:
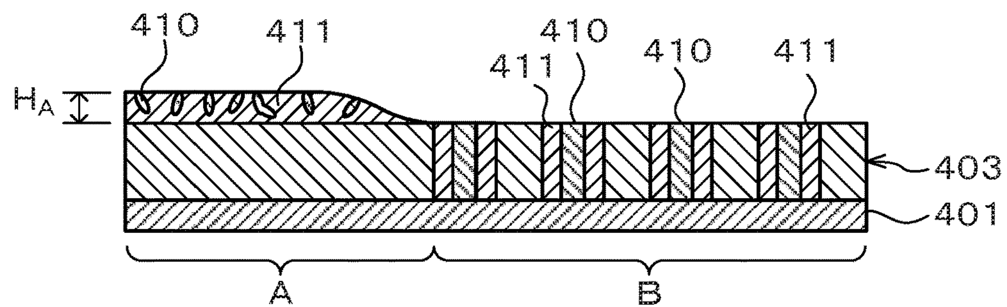
FIG. 12 A longitudinal-sectional explanatory view illustrating an appearance in which the block copolymer is phase-separated into hydrophilic polymers and hydrophobic polymers.
Figure 13:
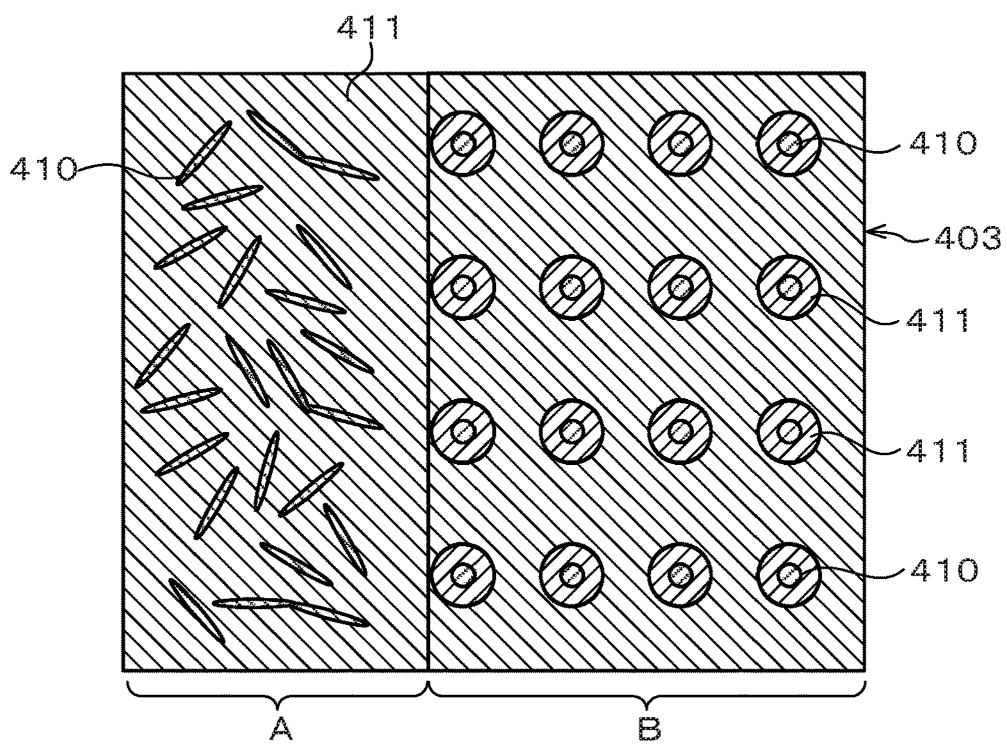
FIG. 13 A plane explanatory view illustrating the appearance in which the block copolymer is phase-separated into the hydrophilic polymers and the hydrophobic polymers.

The wafer W is then carried to the polymer separation apparatus 44, and subjected to a thermal treatment at a predetermined temperature. Thus, the block copolymer 404 on the wafer W is phase-separated into hydrophilic polymers 410 and hydrophobic polymers 411 as illustrated in FIG. 12 and FIG. 13 (polymer separation step, Step S5 in FIG. 7). Here, in the block copolymer 404, the ratio of a molecular weight of the hydrophilic polymer is about 20% to 40% and the ratio of a molecular weight of the hydrophobic polymer is about 80% to 60% as described above. Then, as illustrated in FIG. 12 and FIG. 13, each of the hydrophilic polymers 410 in a columnar shape is phase-separated at the center of the hole portion 403*a* of the resist pattern 403 in the second region B. The hydrophobic polymer 411 is phase-separated in a cylindrical shape to be concentric with the hydrophilic polymer 410 in a manner to surround the outer periphery of the hydrophilic polymer 410. As a result, the hydrophilic polymer 410 and the hydrophobic polymer 411 are phase-separated in desired shapes.

On the other hand, in the first region A, the film thickness of the block copolymer 404A is small and the resist pattern 403 functioning as a guide in phase separation does not exist, so that the block copolymer A cannot be phase-separated into the cylindrical shape as in the second region B, and the hydrophilic polymers 410 and the hydrophobic polymer 411 are phase-separated in irregular shapes, for example, as illustrated in FIG. 12 and FIG. 13.

After the block copolymer 404 is phase-separated in the polymer separation apparatus 44, the wafer W is carried to the ultraviolet irradiation apparatus 41 and irradiated with the ultraviolet ray. Irradiating the wafer W with the ultraviolet ray cuts bonding chains of polymethyl methacrylate being the hydrophilic polymers 410 and causes a cross-linking reaction of polystyrene being the hydrophobic polymers 411 (Step S6 in FIG. 7).

Figure 14:
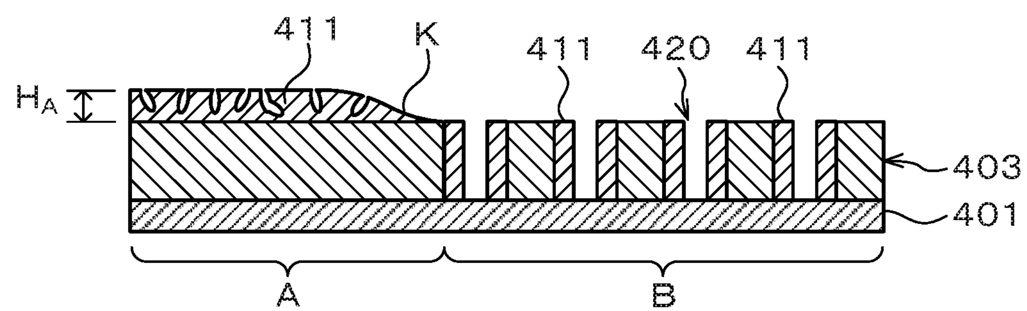
FIG. 14 A longitudinal-sectional explanatory view illustrating a state in which the hydrophilic polymers have been selectively removed after phase separation.

The wafer W is then carried to the organic solvent supply apparatus 31. In the organic solvent supply apparatus 31, an organic solvent having a polarity (polar organic solvent) is supplied to the wafer W. As the polar organic solvent, for example, IPA (isopropyl alcohol) or the like is used. Thus, the hydrophilic polymers 410 whose bonding chains have been cut by the irradiation with the ultraviolet ray are dissolved with the organic solvent, and the hydrophilic polymers 410 are selectively removed from the wafer W (polymer removal step, Step S7 in FIG. 7). As a result, as illustrated in FIG. 14, in the second region B, a hole pattern 420 is formed of the hydrophobic polymers 411. On the other hand, in the first region A, the hydrophilic polymers 410 are selectively removed, whereby the hydrophobic polymer 411 remains in an irregular shape.

Next, normally, the wafer W is carried to the plasma processing apparatus 3, and etching processing is performed on the anti-reflection film 400 and the film to be processed E using the hydrophobic polymers 411 as a mask. However, it has been confirmed by the present inventors that when the etching processing is performed with the hydrophobic polymer 411 in the irregular shape remaining in the first region A as illustrated in FIG. 14, the irregular shape is transferred to the anti-reflection film 400 and the film to be processed E. In the case of etching inorganic films such as the anti-reflection film 400 and the film to be processed E using the hydrophobic polymers 411 being an organic film as a mask, regions corresponding to the hydrophobic polymers 411 are usually not etched if the etching selection ratio is ensured. However, for example, in the case where minute projections and recesses exist as in the hydrophobic polymer 411 existing in the first region A in FIG. 14, the insides of the minute projections and recesses are etched by a microloading effect or the like, resulting in that small holes are formed in the hydrophobic polymer 411. Then, the pattern of the hydrophobic polymer 411 existing in the first region A is considered to be transferred to the lower layer. Hence, in this embodiment, irradiating the wafer W with the ultraviolet ray under an atmosphere containing an oxygen gas before the etching processing is performed in the plasma processing apparatus 3, reduces the film thickness of the hydrophobic polymer 411 existing in the first region A and prevents the pattern from being transferred to the lower layer.

For irradiation with the ultraviolet ray, the wafer W is carried again to the ultraviolet irradiation apparatus 41. Then, the wafer W is mounted on the mounting table 46, and the wafer W is irradiated with the ultraviolet ray while the wafer W is being heated at a temperature lower than a transition point temperature Tg of the block copolymer, almost about 150° C. in this embodiment. In this event, for example, clean air is supplied as the clean oxygen-containing gas from the gas supply source 48 into the treatment container 45.

Figure 15:
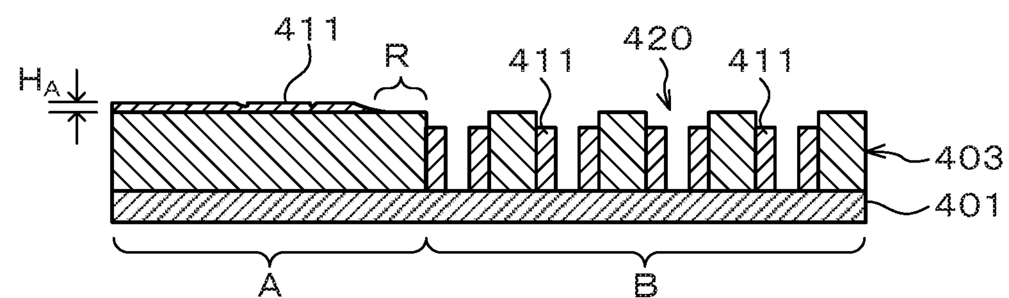
FIG. 15 A longitudinal-sectional explanatory view illustrating a state of the hydrophobic polymers after a film thickness reduction step.

By irradiating the wafer W with the ultraviolet ray in the oxygen gas atmosphere as described above, ozone and active oxygen are generated from the oxygen gas and the wafer W is exposed to an active oxygen atmosphere. By exposing the wafer W to the active oxygen atmosphere while heating the wafer W, the hydrophobic polymers 411 are decomposed and volatilized by the active oxygen, so that the film thickness $H_A$ of the hydrophobic polymer 411 in the first region A is reduced as illustrated in FIG. 15 (film thickness reduction step, Step S8 in FIG. 7). In short, ashing with the active oxygen is performed. Thus, in the first region A, only the hydrophobic polymer 411 in an almost flat shape remains. Further, in the second region B, the height of the hole pattern 420 of the hydrophobic polymers 411 is also reduced.

Thereafter, the wafer W is carried to the cassette C and carried to the plasma processing apparatus 3. Then, etching processing is performed on the anti-reflection film 400 and the film to be processed E using the hydrophobic polymers 411 as a mask in the etching apparatus 102. Thus, the hole pattern 420 is transferred to the film to be processed E (Step S9 in FIG. 7). In this event, the irregular pattern has been almost removed from the hydrophobic polymer 411 in the first region A by the film thickness reduction step (Step S8), so that the irregular pattern is not transferred to the film to be processed E but a pattern in a desired shape can be transferred to the film to be processed E. Note that it is preferable, according to the present inventors, to set the film thickness $H_A$ after reduced by the film thickness reduction step to about half the pitch of the hydrophilic polymer 410 and hydrophobic polymer 411 after the phase separation, and more preferable to almost zero. Note that the pitch of the hydrophilic polymer 410 and hydrophobic polymer 411 mentioned here is, for example, the distance between adjacent hydrophilic polymers 410 when the block copolymer 404 is applied, for example, onto the flat neutral layer 401 and then phase-separated into patterns in the columnar shapes, and is a value decided mainly based on the compounding ratio between the hydrophilic polymers 410 and the hydrophobic polymers 411 in the block copolymer 404.

Then, the hydrophobic polymers 411 and the resist pattern 403 are removed in the plasma processing apparatus 3, whereby a predetermined pattern is formed on the wafer W. The wafer W is thereafter housed in the cassette C, and the cassette C housing wafers W is carried out of the plasma processing apparatus 3, with which a series of wafer processing ends.

According to the above embodiment, for example, the film thickness reduction step (Step S8) of reducing the film thickness $H_A$ of the hydrophobic polymer 411 is performed before the etching processing is performed in the plasma processing apparatus 3, so that even if, for example, an irregular pattern of the hydrophobic polymer 411 is formed in the first region A, the irregular pattern can be prevent from being transferred to the film to be processed E in the etching processing. Therefore, according to the present invention, in the wafer processing using the block copolymer 404 containing the hydrophilic polymers 410 and the hydrophobic polymers 411, a predetermined pattern can be appropriately formed on the wafer W.

Note that though the film thickness reduction step is performed after the block copolymer 404 is phase-separated and the hydrophilic polymers 410 are removed in the above embodiment, the timing when performing the film thickness reduction step is not limited to the contents of this embodiment. Specifically, the film thickness reduction step may be performed at any timing as long as it is after applying the block copolymer 404 in Step S4 and before performing the etching processing in Step S9. For example, the block copolymer 404 is applied and the block copolymer 404 is subjected to hardening processing in the thermal treatment apparatus 40, and then the film thickness reduction step may be performed to reduce the film thickness $H_A$ of the block copolymer 404A as illustrated in FIG. 11, or the film thickness reduction step may be performed in a state after the block copolymer 404 is phase-separated and before the hydrophilic polymers 410 are removed as illustrated in FIG. 12.

Further, in the case of performing the film thickness reduction step before the hydrophilic polymers 410 are removed as described above, the means for reducing the film thickness is not limited to the irradiation with the ultraviolet ray accompanied by heating in the oxygen-containing gas, but the film thickness $H_A$ may be physically or chemically reduced. A conceivable physical processing example is CMP processing of polishing the surface of the wafer W to reduce the film thickness $H_A$ of the block copolymer 404A. Besides, conceivable chemical processing is etching processing, for example, using oxygen plasma. In this case, the etching processing using oxygen plasma can be said the film thickness reduction step with active oxygen in a broad sense. In any case, the film thickness $H_A$ of the block copolymer 404A is reduced to the predetermined value or less in the film thickness reduction step, thereby making it possible to prevent an irregular pattern from being formed in the hydrophobic polymer 411 in the first region A and prevent the irregular pattern from being transferred to the film to be processed E in the etching processing in Step S9. Note that it has been confirmed by the present inventors that use of this method is most preferable in the treatment using both the irradiation with the ultraviolet ray and heating under the oxygen-containing gas atmosphere, because the film thickness can be is isotropically reduced regardless of the shape of the pattern, and the rate of the reduction in film thickness can be controlled by controlling the heating temperature.

Note that the formation of the irregular pattern in the hydrophobic polymer 411 in the first region A is prevented by reducing the film thickness $H_A$ of the block copolymer 404A down to the predetermined value or less by the film thickness reduction step in the above embodiment, but from the viewpoint of preventing the irregular pattern to the film to be processed E, it can be considered to perform, for example, masking with the resist film 402 or the like on the upper surface of the hydrophobic polymer 411 in the first region A when performing the etching processing in Step S9 in the plasma processing apparatus 3. However, for performing the masking with the resist film 402, it is necessary to form the resist film 402 with high accuracy as illustrated, for example, in FIG. 16 to a boundary between the second region B where the pattern is desired to be transferred to the lower layer and the first region A where transfer of the pattern to the lower layer is desired to be prevented. However, performing exposure processing with such an alignment accuracy is very difficult.

Figure 16:
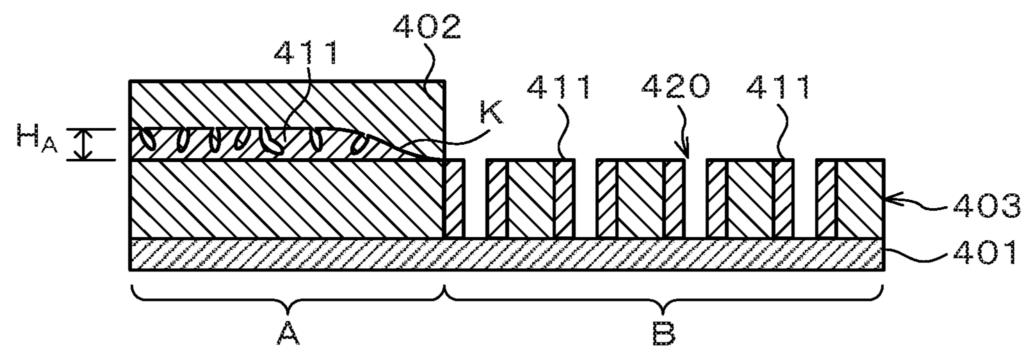
FIG. 16 A longitudinal-sectional explanatory view illustrating an appearance in which a resist film is formed on the hydrophobic polymer in a first region.

Hence, the present inventors have focused attention on that an inclined part K where the film thickness of the block copolymer 404 gradually reduces from the first region A toward the second region B as illustrated in FIG. 16 near the boundary between the first region A and the second region B, and have considered that the film at a portion of the inclined part K is removed to expand the boundary region between the first region A and the second region B, thereby ensuring the margin of the alignment for forming the resist film 402 as a mask. Specifically, as illustrated in FIG. 15, for example, the film thickness reduction step is performed by irradiation with the ultraviolet ray, thereby substantially removing the film at the inclined part K to form a removal region R where the hydrophobic polymer 411 does not exist near the boundary between the first region A and the second region B. Note that it has been confirmed by the present inventors that for forming the removal region R, it is unnecessary to reduce the film thickness $H_A$ of the hydrophobic polymer 411 in the first region A to half the pitch as described above.

Figure 17:
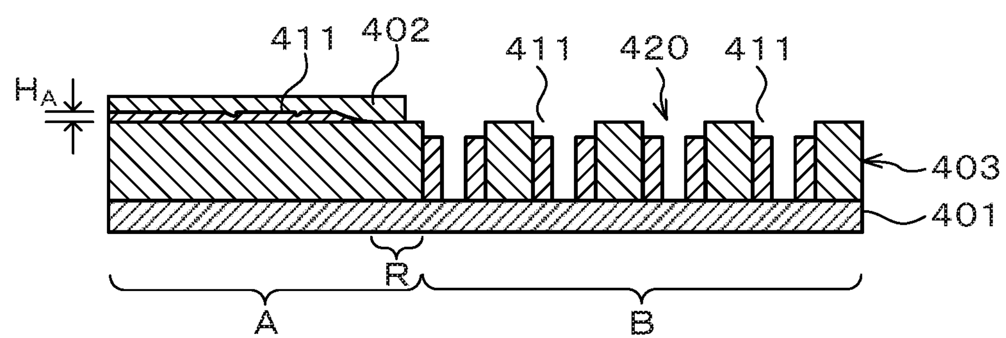
FIG. 17 A longitudinal-sectional explanatory view illustrating an appearance in which a resist film is formed on the hydrophobic polymer in the first region.

Then, after the removal region R is formed, the resist film 402 is applied on the wafer W, and then exposure and developing treatment are performed to form the resist film 402 only in the first region A as illustrated in FIG. 17. In this case, when performing exposure processing on the resist film 402, the removal region R becomes the margin of the alignment, thereby facilitating formation of the resist film 402 only on the hydrophobic polymer 411 remaining in the first region A. Accordingly, when reducing the film thickness $H_A$ of the block copolymer 404A in the film thickness reduction step, it is not always necessary to reduce the film thickness $H_A$ to equal to or less than half the pitch of the pattern of the hydrophilic polymer 410 and hydrophobic polymer 411 but it is only necessary to reduce the film thickness $H_A$ to a level at which the margin of the alignment for exposure processing can be ensured in the removal region R.

Note that as the film thickness reduction step for forming the removal region R, for example, plasma etching processing may be used in addition to the treatment using both the irradiation with the ultraviolet ray and heating under the oxygen atmosphere, and any means can be selected as long as the means can form the removal region R.

Though the case of transferring the resist pattern 403 to the film to be processed E on the wafer W has been described as an example in the above embodiment, the present invention is also applicable to a case of performing, for example, etching on the wafer W to transfer a pattern in a ball shape onto the wafer W. Further, the pattern by the block copolymer 404 is not limited to the hole pattern 420, but the present invention is also applicable to the case of phase-separating the block copolymer 404 into a lamellar structure of line and space.

The removal of the hydrophilic polymers 410 in Step S7 is performed by a so-called wet treatment in the above embodiment, but the method of removing the hydrophilic polymers 410 is not limited to this embodiment and, for example, and the above-described etching processing with plasma may be used.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the embodiment but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in processing a substrate, for example, using a block copolymer containing a hydrophilic polymer having a hydrophilic property and a hydrophobic polymer having a hydrophobic property.

EXPLANATION OF CODES

1 substrate processing system
30 developing apparatus
31 organic solvent supply apparatus
32 anti-reflection film forming apparatus
33 neutral layer forming apparatus
34 resist coating apparatus
35 coating film forming apparatus
36 resist removing apparatus
37 block copolymer coating apparatus
40 thermal treatment apparatus
41 ultraviolet irradiation apparatus
42 adhesion apparatus
43 edge exposure apparatus
44 polymer separation apparatus
300 control unit
400 anti-reflection film
401 neutral layer
402 resist film
403 resist pattern
404 polystyrene film
410 block copolymer
411 hydrophilic polymer
412 hydrophobic polymer
W wafer

What is claimed is:

1. A substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by irradiating the substrate in an atmosphere containing an oxygen gas with an ultraviolet ray and exposing the substrate on which the coating film of the block copolymer is formed to an active oxygen atmosphere.

2. The substrate processing method according to claim 1, wherein the substrate on which the coating film of the block copolymer is formed is heat-treated at a predetermined temperature while the substrate is being exposed to the active oxygen atmosphere.

3. A substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by:

irradiating the substrate in an atmosphere containing an oxygen gas with an ultraviolet ray and exposing the substrate on which the coating film of the block copolymer is formed to an active oxygen atmosphere; and thereafter performing plasma processing with oxygen gas-containing plasma on the substrate on which the coating film of the block copolymer is formed.

4. The substrate processing method according to claim 3, wherein the substrate on which the coating film of the block copolymer is formed is heat-treated at a predetermined temperature while the substrate is being exposed to the active oxygen atmosphere.

5. A substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by performing plasma processing with oxygen gas-containing plasma on the substrate on which the coating film of the block copolymer is formed.

6. A substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced to equal to or less than half a pitch of the hydrophilic polymer and hydrophobic polymer which are phase-separated by the polymer separation step.

7. A non-transitory computer readable storage medium storing a program running on a computer of a control unit which controls a substrate processing system to cause the substrate processing system to execute a substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by irradiating the substrate in an atmosphere containing an oxygen gas with an ultraviolet ray and exposing the substrate on which the coating film of the block copolymer is formed to an active oxygen atmosphere.

8. The non-transitory computer readable storage medium according to claim 7, wherein the substrate on which the coating film of the block copolymer is formed is heat-treated at a predetermined temperature while the substrate is being exposed to the active oxygen atmosphere.

9. A non-transitory computer readable storage medium storing a program running on a computer of a control unit which controls a substrate processing system to cause the substrate processing system to execute a substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by:

irradiating the substrate in an atmosphere containing an oxygen gas with an ultraviolet ray and exposing the substrate on which the coating film of the block copolymer is formed to an active oxygen atmosphere; and thereafter performing plasma processing with oxygen gas-containing plasma on the substrate on which the coating film of the block copolymer is formed.

10. The non-transitory computer readable storage medium according to claim 9, wherein the substrate on which the coating film of the block copolymer is formed is heat-treated at a predetermined temperature while the substrate is being exposed to the active oxygen atmosphere.

11. A non-transitory computer readable storage medium storing a program running on a computer of a control unit which controls a substrate processing system to cause the substrate processing system to execute a substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced by performing plasma processing with oxygen gas-containing plasma on the substrate on which the coating film of the block copolymer is formed.

12. A non-transitory computer readable storage medium storing a program running on a computer of a control unit which controls a substrate processing system to cause the substrate processing system to execute a substrate processing method of processing a substrate using a block copolymer containing a hydrophilic polymer and a hydrophobic polymer, the substrate processing method comprising:

a block copolymer coating step of applying the block copolymer onto the substrate on which a predetermined projecting and recessed pattern is formed, to form a coating film of the block copolymer;

a polymer separation step of phase-separating the block copolymer into the hydrophilic polymer and the hydrophobic polymer;

a polymer removal step of selectively removing the hydrophilic polymer from the phase-separated block copolymer; and after the block copolymer coating step and before the polymer removal step, a film thickness reduction step of reducing a film thickness of the coating film of the block copolymer, wherein in the film thickness reduction step, the film thickness of the coating film of the block copolymer is reduced to equal to or less than half a pitch of the hydrophilic polymer and hydrophobic polymer which are phase-separated by the polymer separation step.

* * * * *